(12) United States Patent
Chung et al.

(10) Patent No.: US 12,740,213 B2
(45) Date of Patent: Sep. 15, 2026

(54) LED LIGHT SOURCE MODULE

(71) Applicant: Radiant Opto-Electronics Corporation, Kaohsiung (TW)

(72) Inventors: Chih-Hsien Chung, Kaohsiung (TW); Hsiu-Hung Yeh, Kaohsiung (TW); Ching-Yuan Chen, Kaohsiung (TW)

(73) Assignee: Radiant Opto-Electronics Corporation, Kaohsiung (TW)

( * ) Notice: Subject to any disclaimer, the term of this patent is extended or adjusted under 35 U.S.C. 154(b) by 565 days.

(21) Appl. No.: 18/311,903

(22) Filed: May 4, 2023

(65) Prior Publication Data

US 2023/0275201 A1 Aug. 31, 2023

Related U.S. Application Data

(63) Continuation of application No. PCT/CN2020/127533, filed on Nov. 9, 2020.

(51) Int. Cl.
*H10H 20/857* (2025.01)
*F21V 23/06* (2006.01)

(52) U.S. Cl.
CPC .......... *H10H 20/857* (2025.01); *F21V 23/06* (2013.01)

(58) Field of Classification Search
CPC ............ H10H 20/857; H10H 20/8506; H10H 29/857; H10H 29/922; H10H 20/8502; H10H 20/8504; H10H 20/8508; H10H 29/8506; H10H 29/8508; F21V 23/06; H10W 90/00
See application file for complete search history.

(56) References Cited

U.S. PATENT DOCUMENTS

| | | | |
|---|---|---|---|
| 10,705,375 | B2 | 7/2020 | Watanabe et al. |
| 10,761,360 | B2 | 9/2020 | Ide et al. |
| 2010/0123851 | A1 | 5/2010 | Mo et al. |

(Continued)

FOREIGN PATENT DOCUMENTS

| | | | |
|---|---|---|---|
| CN | 201129643 | Y | 10/2008 |
| CN | 102681234 | A | 9/2012 |

(Continued)

OTHER PUBLICATIONS

English translation CN210199452 (Year: 2020).*

*Primary Examiner* — Latanya N Crawford Eason
(74) *Attorney, Agent, or Firm* — CKC & Partners Co., LLC

(57) ABSTRACT

An LED light source module includes a substrate; a protective layer disposed on the substrate and having at least one opening; a plurality of conductive terminals disposed in the at least one opening, a light-emitting member, a plurality of electrodes, and an auxiliary structure. The conductive terminals include a first conductive terminal and a second conductive terminal. The light-emitting member includes a bottom surface, a light-emitting surface connected to the bottom surface, a back surface opposite to the light-emitting surface, at least one lateral surface connecting the light-emitting surface and the bottom surface. The auxiliary structure includes a main support portion provided on the substrate to support the bottom surface of the light-emitting member, and the main support portion is located between the electrodes and extends at least from the back surface to the light-emitting surface of the light-emitting member.

8 Claims, 17 Drawing Sheets

(56) References Cited

U.S. PATENT DOCUMENTS

| | | | | |
|---|---|---|---|---|
| 2012/0050635 | A1 | 3/2012 | Yoo et al. | |
| 2013/0193464 | A1 | 8/2013 | Bae et al. | |
| 2019/0128480 | A1* | 5/2019 | Chung | F21K 9/90 |

FOREIGN PATENT DOCUMENTS

| | | | | | |
|---|---|---|---|---|---|
| CN | 103712167 | A | | 4/2014 | |
| CN | 106287321 | A | | 1/2017 | |
| CN | 207635016 | U | | 7/2018 | |
| CN | 210199452 | U | * | 3/2020 | F21V 23/06 |
| TW | 201021638 | A | | 6/2010 | |
| TW | 201917879 | A | | 5/2019 | |
| WO | 2017073471 | A1 | | 5/2017 | |

* cited by examiner

LED LIGHT SOURCE MODULE

RELATED APPLICATIONS

This application is a continuation application of International Application No. PCT/CN2020/127533, filed on Nov. 9, 2020. The entire disclosures of all the above applications are hereby incorporated by reference.

BACKGROUND

Field of Invention

The present invention relates to an LED light source module, and in particular, to an LED light source module having an auxiliary structure.

Description of Related Art

A light-emitting diode (LED) is a luminous semiconductor electronic element. Modern LEDs are available across the visible, ultraviolet, and infrared wavelengths, with very high brightness.

Generally, most LEDs have two electrodes on their bottom surface. When affixing one of the aforementioned LEDs to a printed circuit board (PCB) of a light bar, surface mounting technology (SMT) is mainly used. Openings are formed on a protecting film, and the electrodes can be electrically connected to pads of the printed circuit board through the openings. In detail, solder is firstly printed on the pads of the printed circuit board, and then the LEDs can be placed on the pads having solder. Finally, the LEDs can be affixed to the pads by heating them with a reflow furnace.

However, when the LEDs are inserted into the openings of the protecting film, the LEDs can easily be inclined, and the precision of alignment of the LEDs in the perpendicular direction is influenced. The light may not be aligned with the receiving surface (such as a light-entering surface of a light guiding plate), or a partial light may be covered by the wall of the openings. In other situation, the heights of the LEDs are lower than the aforementioned receiving surface because of a reflection sheet or other object is placed below the aforementioned receiving surface, result in the lights of the LEDs may not be aligned with the receiving surface. Therefore, the utilization efficiency of light is reduced.

SUMMARY

In order to solve the above-mentioned conventional problems, the present invention provides an LED light source module, which includes: a substrate; a protective layer disposed on the substrate and having at least one opening; a plurality of conductive terminals disposed in the at least one opening, wherein the conductive terminals include a first conductive terminal and a second conductive terminal; a light-emitting member, including a bottom surface, a light-emitting surface connected to the bottom surface, a back surface opposite to the light-emitting surface, at least one lateral surface connecting the light-emitting surface and the bottom surface, and a plurality of electrodes, wherein the electrodes include a first electrode and a second electrode are electrically connected to the first conductive terminal and the second conductive terminal respectively; and an auxiliary structure, which is arranged between the substrate and the light-emitting member and does not contact with the first electrode and the second electrode, wherein the auxiliary structure includes a main support portion provided on the substrate to support the bottom surface of the light-emitting member, and the main support portion is located between the electrodes and extends at least from the back surface to the light-emitting surface of the light-emitting member.

The present invention also provides an LED light source module, including: a substrate; a protective layer disposed on the substrate and having at least one opening; a plurality of conductive terminals disposed in the at least one opening; a light-emitting member including a bottom surface, a first lateral surface connected to the bottom surface, a second lateral surface connected to the bottom surface and opposite to the first lateral surface, and a plurality of electrodes, wherein the plurality of electrodes are electrically connected to a plurality of conductive terminals respectively; and an auxiliary structure including at least two interposed portions, the interposed portions are arranged between the substrate and the light-emitting member, and the interposed portions correspond to the first lateral surface and the second lateral surface of the light-emitting member respectively, the interposed portions support the bottom surface of the light-emitting member.

DETAILED DESCRIPTION

The making and using of the embodiments of the LED light source module are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure.

Unless defined otherwise, all technical and scientific terms used herein have the same meaning as commonly understood by one of ordinary skill in the art to which this invention belongs. It should be appreciated that each term, which is defined in a commonly used dictionary, should be interpreted as having a meaning conforming to the relative skills and the background or the context of the present disclosure, and should not be interpreted in an idealized or overly formal manner unless defined otherwise.

The First Cluster of Embodiments

Figure 1:
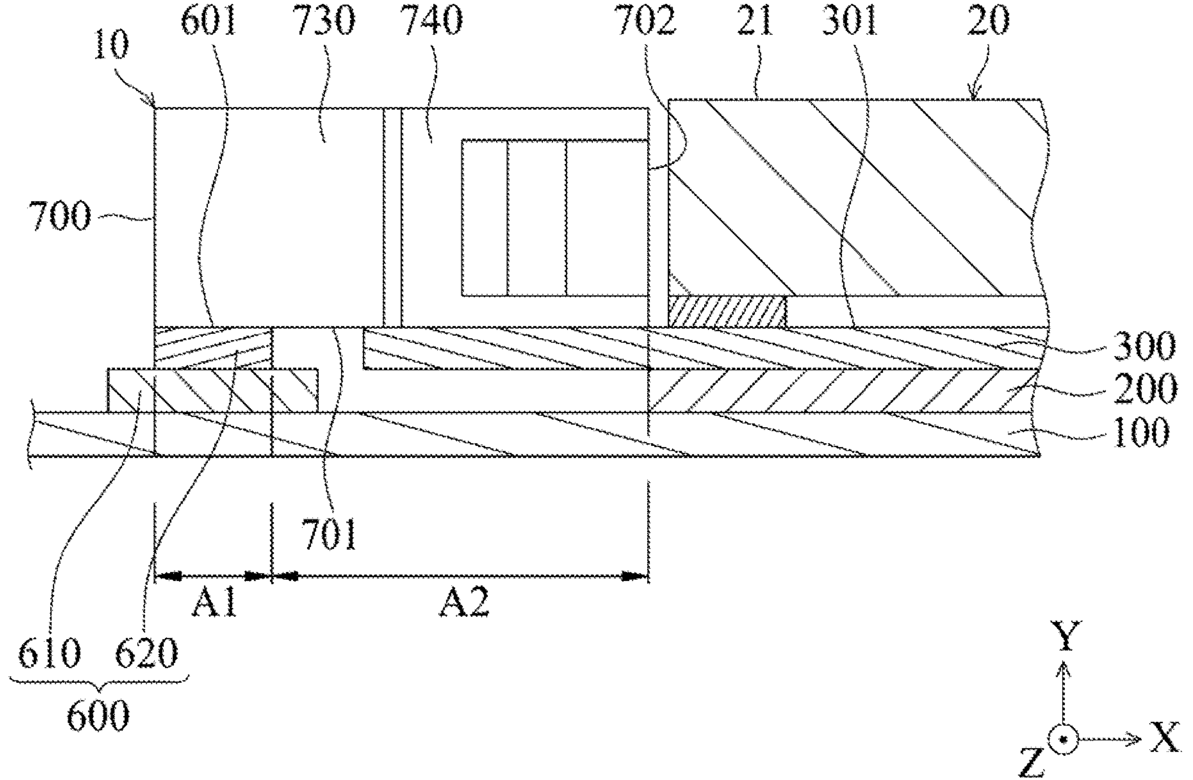
FIG. 1 is a section view of an LED light source module according to a first embodiment of this invention.
Figure 2A:
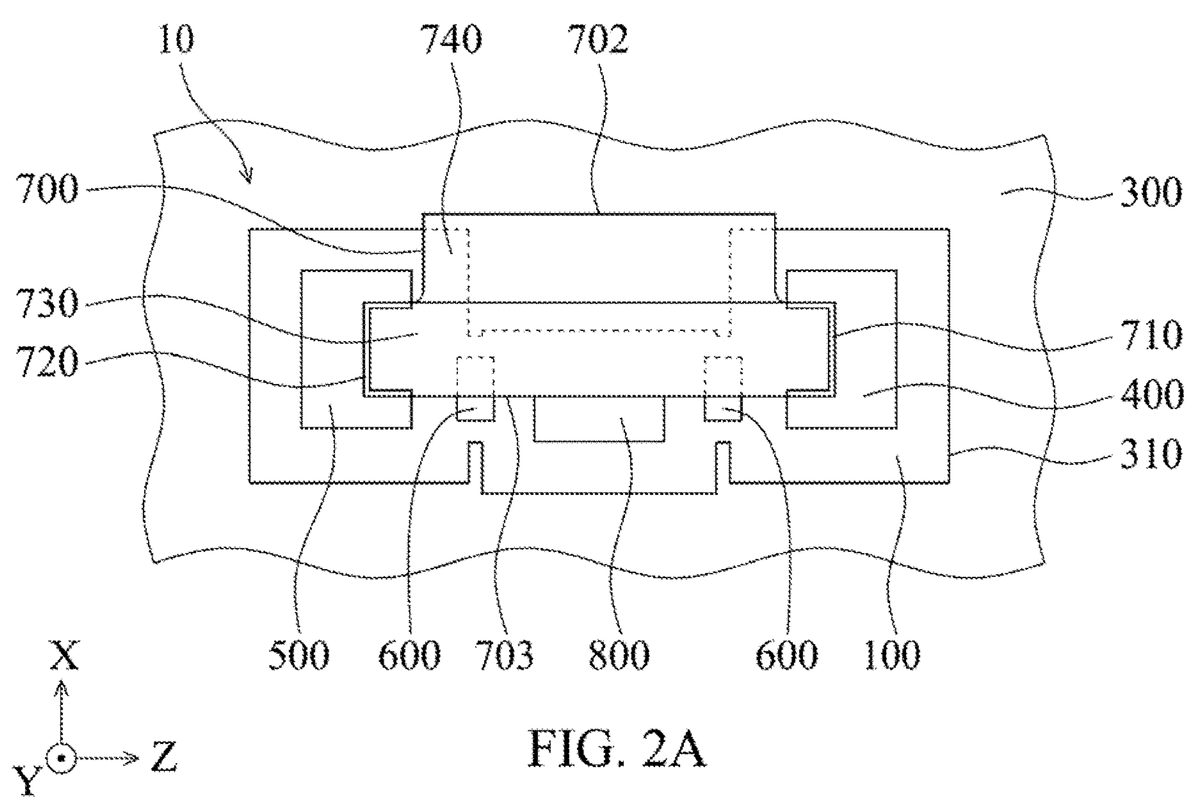
FIG. 2A is a partial top view of an LED light source module according to the first embodiment of this invention.

Referring to FIGS. 1 and 2A, in an embodiment of the invention, an LED light source module 10 can be optically coupled to a light guiding member 20 (such as a light guiding plate). The LED light source module 10 provides light from the lateral side of the light guiding member 20. After entering the light guiding member 20, the light can be guided thereby and form a surface light on a light-emitting surface 21. The LED light source module 10 primarily comprises a substrate 100, a wiring layer 200, a protective layer 300, a first conductive terminal 400, a second conductive terminal 500, at least one auxiliary structure 600, a light-emitting member 700, and a blocking member 800.

The wiring layer 200 and the protective layer 300 of the LED light source module 10 are disposed on the substrate 100, and the wiring layer 200 is disposed between the substrate 100 and the protective layer 300. The first conductive terminal 400, the second conductive terminal 500, and the auxiliary structure 600 are formed by patterned etching the wiring layer 200 on the substrate 100, therefore, the aforementioned members are formed on the same level above the substrate 100. The protective layer 300 is formed on the wiring layer 200, and has an opening 310. The first conductive terminal 400, the second conductive terminal 500, and the auxiliary structure 600 are exposed from the opening 310, and the light-emitting member 700 can be soldered thereon. The purpose of disposing on the substrate 100 and accommodating in the opening 310 can be achieved. It should be noted that, the first conductive terminal 400, the second conductive terminal 500, and the auxiliary structure 600 are separated from each other, and the auxiliary structure 600 is disposed between the first conductive terminal 400 and the second conductive terminal 500 (as shown in FIG. 2A).

As shown in FIGS. 1 and 2A, the light-emitting member 700 is disposed on the auxiliary structure 600, and the auxiliary structure 600 is disposed between the light-emitting member 700 and the substrate 100. Since the top surface 601 of the auxiliary structure 600 is substantially aligned with the top surface 301 of the protective layer 300, the bottom surface 701 of the light-emitting member 700 can contact the aforementioned two top surfaces 601 and 301. Therefore, the light-emitting member 700 can be horizontally disposed relative to the light guiding member 20. In other words, the back region of the light-emitting member 700 is supported by the auxiliary structure 600, and the light-emitting member 700 maintains horizontal in the XY-plane as shown in FIG. 1. To further illustrate, the auxiliary structure 600 is supported on the first area A1 of the bottom surface 701 of the light-emitting member 700. Compared to the first area A1 where the auxiliary structure 600 is located, the area of the bottom surface 701 of the light-emitting member 700 that is not supported by the auxiliary structure 600 is the second area A2. The second area A2 is closer to the light-emitting surface 702 of the light-emitting member 700 than the first area A1, and the first area A1 is located behind the second area A2. Thus, the light-emitting member 700 with the back region inclined downwardly and the front region inclined upwardly is not easily appeared. The problem of the reduced utilization efficiency of light, which is generated from the light is not aligned with the receiving surface or a partial light is covered by the wall of the openings, can be solved.

In this embodiment, the top surface 601 of the auxiliary structure 600 is substantially aligned with the top surface 301 of the protective layer 300, and the auxiliary structure 600 comprises a third conductive terminal 610 and an insulating layer 620, wherein the third conductive terminal 610 is disposed between the insulating layer 620 and the substrate 100, and the insulating layer 620 is disposed between the light-emitting member 700 and the third conductive terminal 610. The total thickness of the third conductive terminal 610 and the insulating layer 620 is substantially the same as the distance between the top surface 301 of the protective layer 300 and the substrate 100. For example, the thickness of the third conductive terminal 610 can be 10 mm-15 mm, and the thickness of the insulating layer 620 can be 10 mm-15 mm. Therefore, the thickness of the whole auxiliary structure 600 is 20 mm-30 mm.

The third conductive terminal 610, the wiring layer 200, the first conductive terminal 400, and the second conductive terminal 500 can comprise same conductive material, such as copper, aluminum, or an alloy thereof. The insulating layer 620 can comprise suitable insulating material, such as liquid photoimageable solder mask (LPSM). The third conductive terminal 610, the first conductive terminal 400, and the second conductive terminal 500 are formed by pattern etching the wiring layer 200 on the substrate 100, therefore, the aforementioned three members are the same height. Since the auxiliary structure 600 further includes the insulating layer 620 on the third conductive terminal 610, the height of the auxiliary structure 600 is greater than the height of the first conductive terminal 400 and the second conductive terminal 500.

Referring to FIGS. 1 and 2A, the light-emitting member 700 comprises a first electrode 710 and a second electrode 720. In this embodiment, the first electrode 710 and the second electrode 720 are respectively disposed on the opposite lateral surfaces connected to the bottom surface 701. When the light-emitting member 700 is disposed on the auxiliary structure 600 and an SMT process is performed, the heated solder easily congregates in the area having exposed metal due to the characteristic of its surface tension. Thus, the heated solder can fill the spaces between the first electrode 710 and the first conductive terminal 400, and between the second electrode 720 and the second conductive terminal 500, and the first electrode 710 and the second electrode 720 can be respectively electrically connected to the first conductive terminal 400 and the second conductive terminal 500. The required power can be supplied to the light-emitting member 700.

Furthermore, the light-emitting member 700 can be divided into an assembly portion 730 and an excitation portion 740. The first electrode 710 and the second electrode 720 are disposed on the assembly portion 730, and a plurality of phosphor members (such as phosphor powders) are disposed in the excitation portion 740. When the power enters the light-emitting member 700 through the first electrode 710 and the second electrode 720, the phosphor members can be excited and emit light from the light-emitting surface 702.

It should be noted that, as shown in FIGS. 1 and 2A, a portion of the protective layer 300 is extended to the area between the substrate 100 and the excitation portion 740 of the light-emitting member 700, and the surface of the protective layer 300 has a color with high reflectivity and low absorptance, such as white. Therefore, when the light-emitting member 700 emits light to the light guiding member 20 and the light guiding member 20 generates a surface light, even if a partial light enters light guiding member 20 after reflecting by the protective layer 300, the color difference does not appear on the surface light. In some embodiments, the surface of the protective layer 300 has a color with low reflectivity and high absorptance, such as black. This protective layer 300 is used to the LED light source module 10 having the high brightness light-emitting member 700, so as to absorb the energy of the light-emitting member 700, and the problem of the bright line in the back light module can be avoided.

As shown in FIG. 2A, the blocking member 800 is disposed on the substrate 100 and accommodated in the opening 310 of the protective layer 300. When the light-emitting member 700 is disposed on the auxiliary structure 600, the blocking member 800 is in contact with the lateral surface 703 of the light-emitting member 700 opposite to the light-emitting surface 702. Therefore, if the light guiding member 20 pushes against the light-emitting member 700 along the −X-axis when assembling, the blocking member 800 can provide enough supporting force to prevent the light-emitting member 700 from moving or tilting.

For providing enough supporting strength, the blocking member 800 can comprise metal material, such as copper, aluminum, or an alloy thereof, and the substrate 100 and the protective layer 300 can comprise suitable insulating material. For example, the substrate 100 can comprise polyimide (PI).

The structure of the aforementioned LED light source module 10 can ensure that the light-emitting member 700 is horizontally disposed relative to the light guiding member 20, and the light from the light-emitting member 700 is not covered by other members. Thus, the utilization efficiency of light can be enhanced.

Figure 2B:
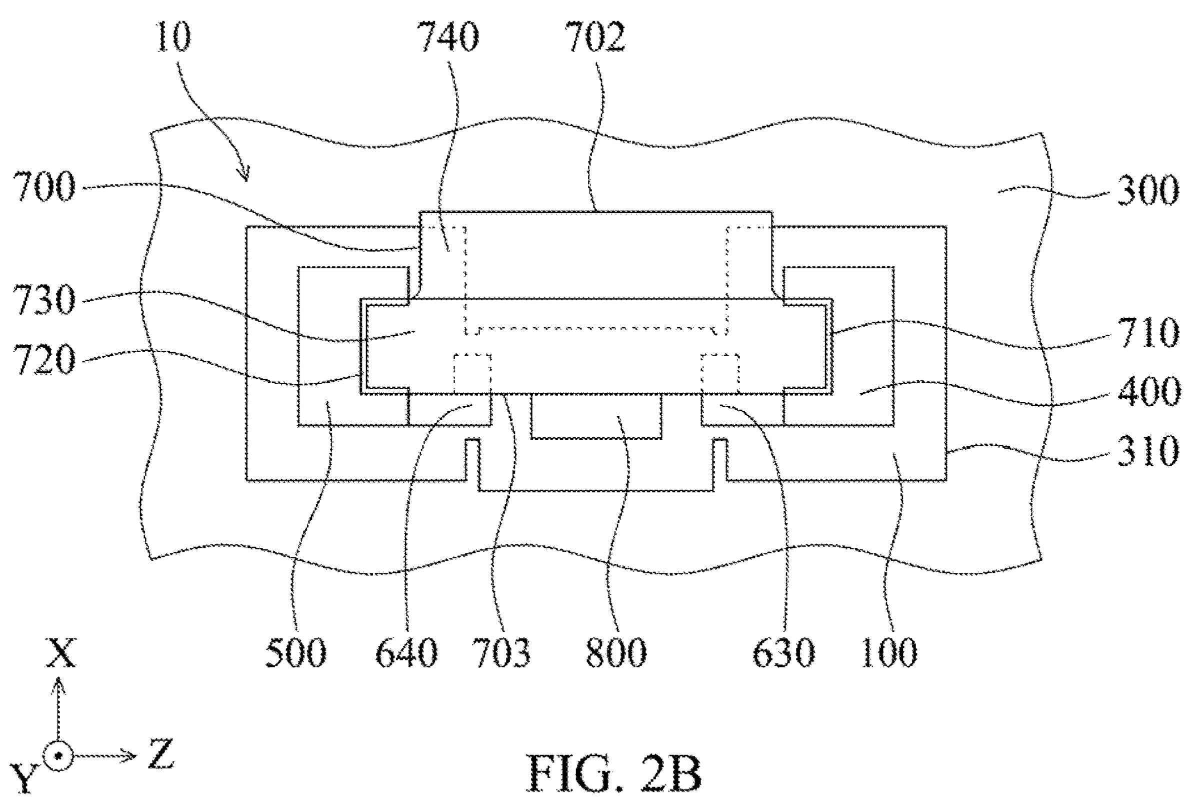
FIG. 2B is a partial top view of another type of an LED light source module according to the first embodiment of this invention.

Referring to FIG. 2B, in another embodiment of the invention, the auxiliary structure 600 is constituted by a first extension 630 and a second extension 640. The first extension 630 extends from the first conductive terminal 400 toward the second conductive terminal 500, and enters the area between the light-emitting member 700 and the substrate 100. The second extension 640 extends from the second conductive terminal 500 toward the first conductive terminal 400, and enters the area between the light-emitting member 700 and the substrate 100. The first extension 630 and the first conductive terminal 400 can be integrally formed as one piece, and the second extension 640 and the second conductive terminal 500 can be integrally formed as one piece.

An insulating material can be coated on the surfaces of the first extension 630 and the second extension 640, so as to avoid the short circuit of the first electrode 710 and/or the second electrode 720. For example, the aforementioned insulating material can be liquid photoimageable solder mask. Instead, the first extension 630 and the second extension 640 can respectively extend to the position away from the first electrode 710 and the second electrode 720, and then enter the area between the light-emitting member 700 and the substrate 100.

Figure 3:
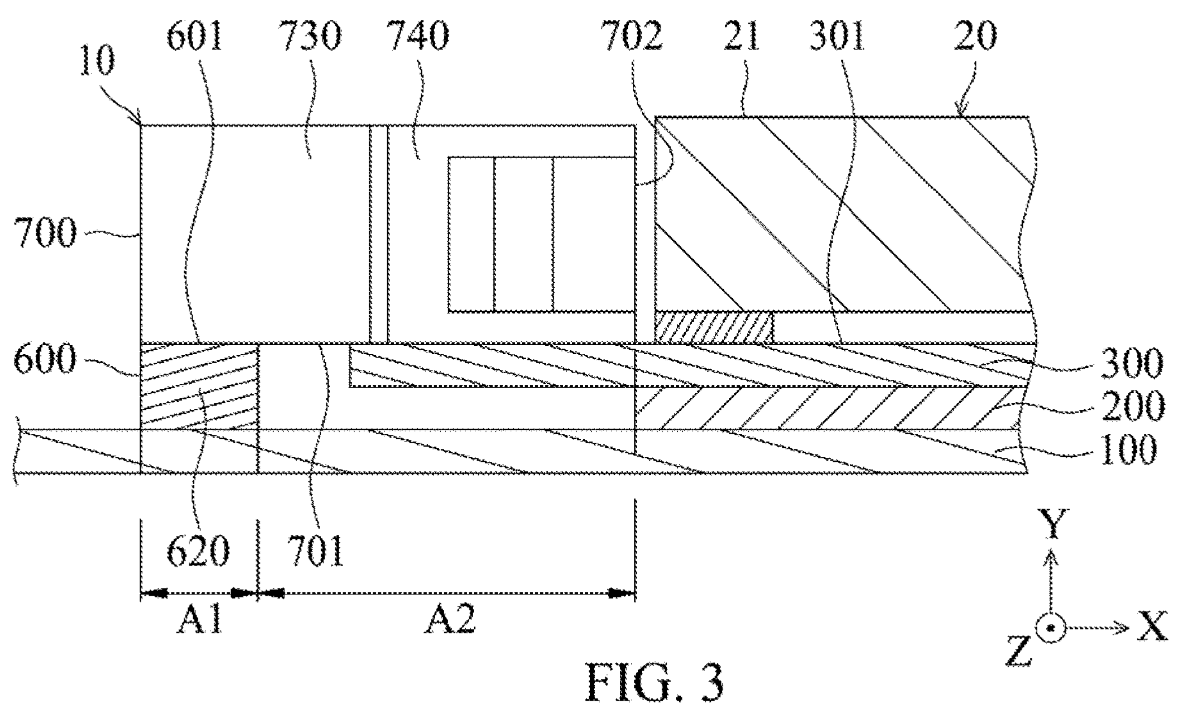
FIG. 3 is a section view of another type of an LED light source module according to the first embodiment of this invention.

Referring to FIG. 3, in another embodiment of the invention, the auxiliary structure 600 of the LED light source module 10 only comprises an insulating layer 620. The insulating layer 620 is in direct contact with the substrate 100 and the bottom surface 701 of the light-emitting member 700, and the thickness of the insulating layer 620 is substantially the same as the distance between the top surface 301 of the protective layer 300 and the substrate 100. Thus, the top surface 601 of the auxiliary structure 600 is substantially aligned with the top surface 301 of the protective layer 300. The insulating layer 620 can comprise liquid photoimageable solder mask, and its thickness can be 10 mm-30 mm (such as 25 mm).

Figure 4:
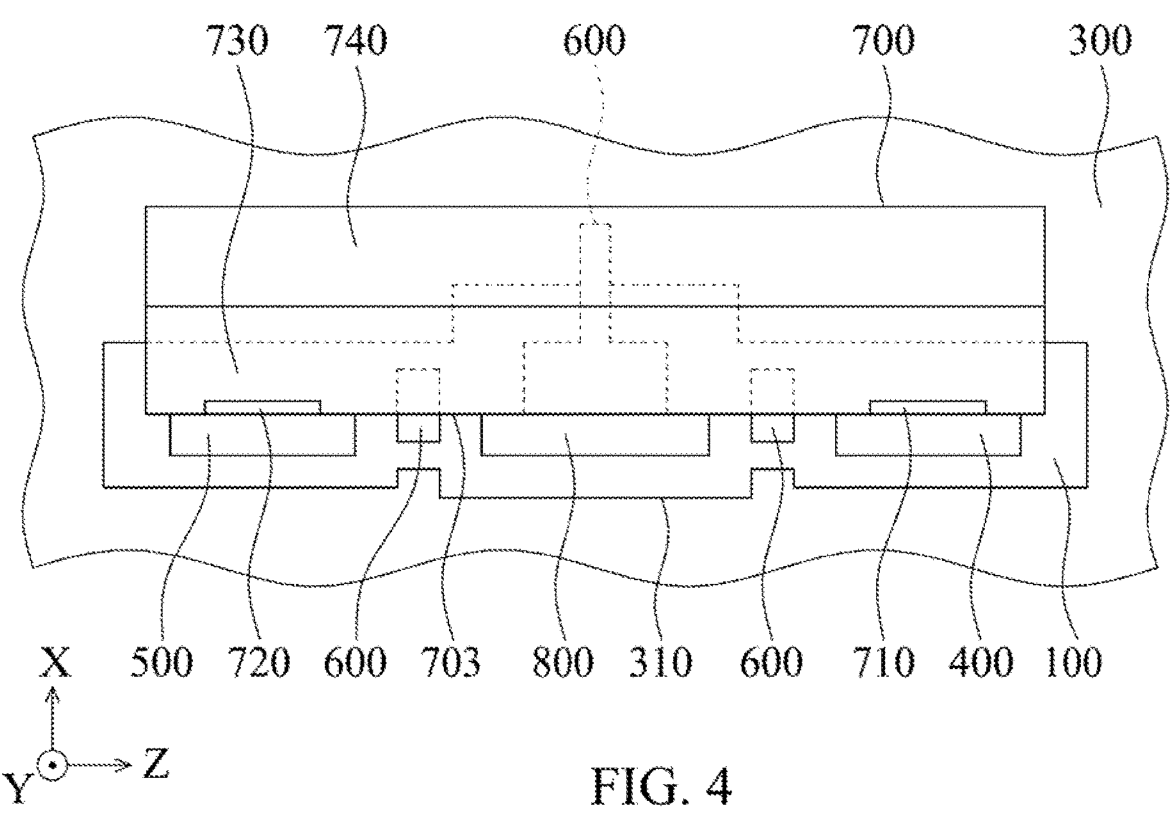
FIG. 4 is a partial top view of another type of an LED light source module according to the first embodiment of this invention.

Referring to FIG. 4, in another embodiment of the invention, the LED light source module 10 comprises a plurality of auxiliary structures 600. These auxiliary structures 600 can be constituted by a third conductive terminal 610 and an insulating terminal 620 (the same as the auxiliary structure 600 in FIG. 1), or constituted by a single insulating terminal 620 (the same as the auxiliary structure 600 in FIG. 3). The auxiliary structure 600 in the center can be extended from the blocking member 800 to the protective layer 300, therefore, the light-emitting member 700 can be disposed more stable.

In this embodiment, both the first electrode 710 and the second electrode 720 of the light-emitting member 700 are disposed on the lateral surface 703 opposite to the light-emitting surface 702. Thus, the first conductive terminal 400, the second conductive terminal 500, and the blocking member 800 contact the same surface of the light-emitting member 700 (i.e. lateral surface 703). Moreover, the first electrode 710 and the second electrode 720 can be electrically connected to the first conductive terminal 400 and the second conductive terminal 500. In some embodiments, the first electrode 710 and the second electrode 720 can be disposed on the bottom surface 701 of the light-emitting member 700, or extended from the lateral surface 703 to the bottom surface 701.

Figure 5:
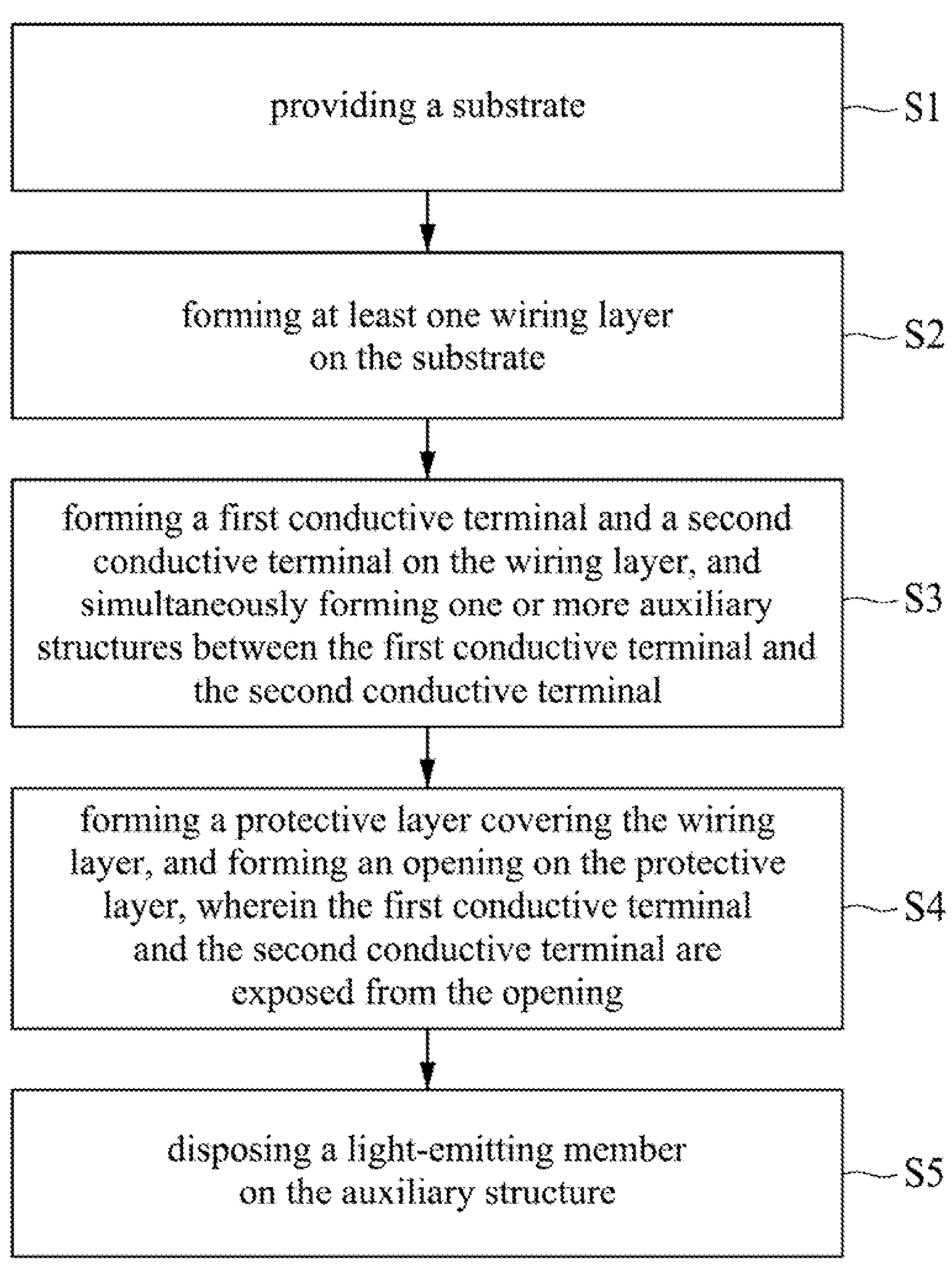
FIG. 5 is a flow chart of a method for producing an LED light source module according to the first embodiment of this invention.

Referring to FIGS. 1, 2A, and 5, the method for manufacturing the LED light source module 10 in FIGS. 1 and 2A is discussed below. First, a substrate 100 can be provided (step S1), and at least one wiring layer 200 can be formed on the substrate 100 (step S2).

Second, a first conductive terminal 400 and a second conductive terminal 500 can be formed on the wiring layer 200, and one or more auxiliary structures 600 can be simultaneously formed between the first conductive terminal 400 and the second conductive terminal 500 (step S3). It should be noted that, the step of forming the auxiliary structure 600 comprise forming a third conductive terminal 610 on the wiring layer 200, and disposing an insulating layer 620 on the third conductive terminal 610, wherein the third conductive terminal 610 is disposed between the first conductive terminal 400 and the second conductive terminal 500.

Next, a protective layer 300 covering the wiring layer 200 can be formed, and an opening 310 can be formed on the protective layer 300, wherein the first conductive terminal 400 and the second conductive terminal 500 are exposed from the opening 310 (step S4).

Finally, the light-emitting member 700 can be disposed on the auxiliary structure 600 (step S5), so as to form the LED light source module 10 in FIGS. 1 and 2A. The first electrode 710 and the second electrode 720 of the light-emitting member 700 are respectively electrically connected to the first conductive terminal 400 and the second conductive terminal 500, and the bottom surface 701 of the light-emitting member 700 is in contact with the auxiliary structure 600.

In this embodiment, since the third conductive terminal 610 can be formed by patterned etching the wiring layer 200 on the substrate 100, the step of forming the third conductive terminal 610 and the step of forming the first conductive terminal 400 and the second conductive terminal 500 can be accomplished in the same process, so as to simplify the process and reduce the manufacturing time. After the aforementioned process, the insulating layer 620 can be disposed on the third conductive terminal 610. Furthermore, in some embodiments, the method further comprises the step of forming a blocking member 800 on the substrate 100. Similarly, in some embodiments, the step of forming the blocking member 800 and the step of forming the first conductive terminal 400 and the second conductive terminal 500 can be accomplished in the same process. An insulating material can be further disposed on the portion of the blocking member 800 contacting the light-emitting member 700.

Figure 6:
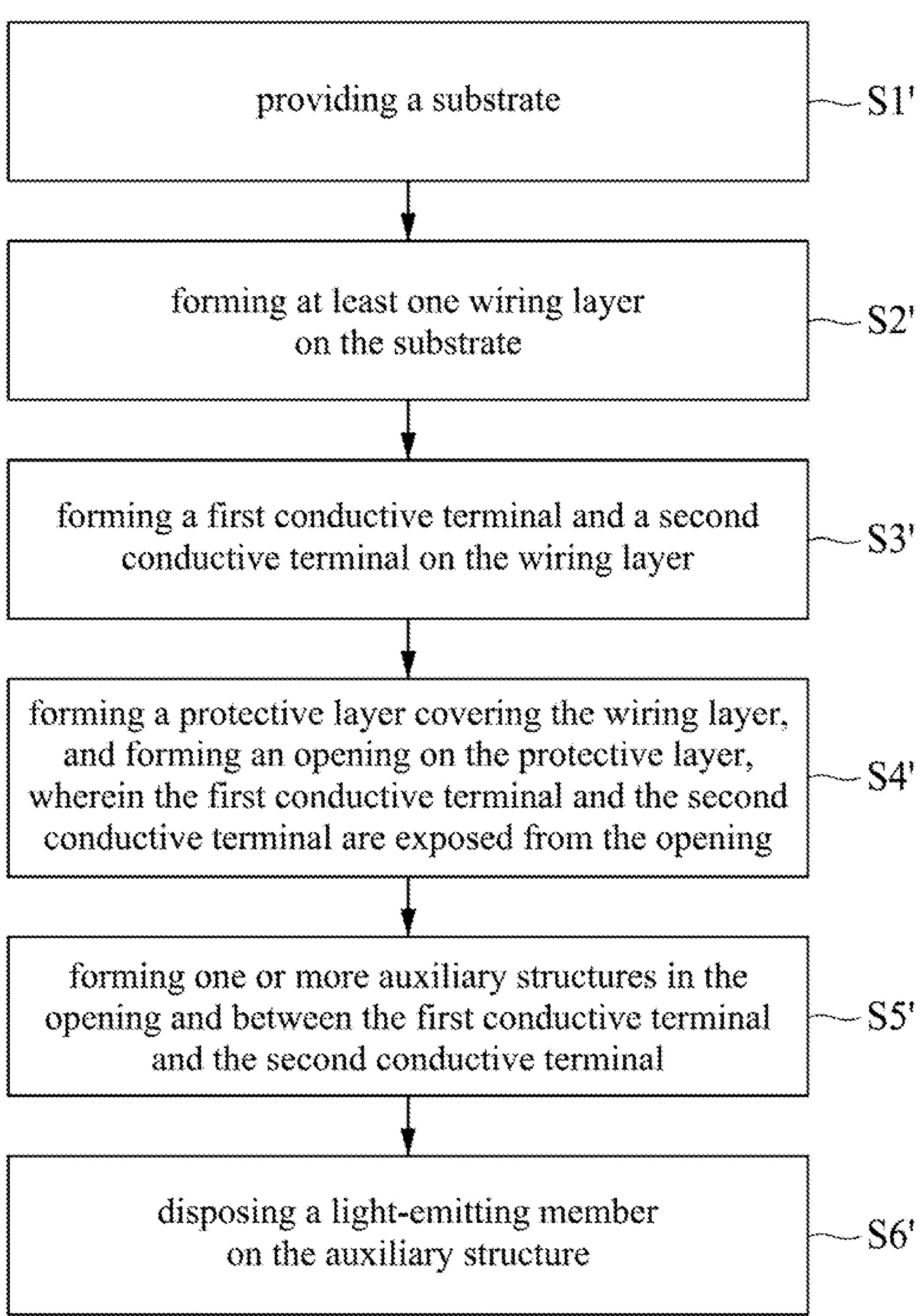
FIG. 6 is a flow chart of a method for producing another type of an LED light source module according to the first embodiment of this invention.

Referring to FIGS. 3 and 6, the method for manufacturing the LED light source module 10 in FIG. 3 is discussed below. First, a substrate 100 can be provided (step S1'), and at least one wiring layer 200 can be formed on the substrate 100 (step S2').

Second, a first conductive terminal 400 and a second conductive terminal 500 can be formed on the wiring layer 200 (step S3'). Subsequently, a protective layer 300 covering the wiring layer 200 can be formed, and an opening 310 can be formed on the protective layer 300, wherein the first conductive terminal 400 and the second conductive terminal 500 are exposed from the opening 310 (step S4').

Next, one or more auxiliary structures 600 can be formed in the opening 310 and disposed between the first conductive terminal 400 and the second conductive terminal 500 (step S5'). It should be noted that, in this embodiment, the step of forming the auxiliary structure 600 comprises forming an insulating layer 620 on the substrate 100 directly.

Finally, the light-emitting member 700 can be disposed on the auxiliary structure 600 (step S6'), so as to form the LED light source module 10 in FIG. 3. Similarly, the first electrode 710 and the second electrode 720 of the light-emitting member 700 are respectively electrically connected to the first conductive terminal 400 and the second conductive terminal 500, and the bottom surface 701 of the light-emitting member 700 is in contact with the auxiliary structure 600.

In this embodiment, since the auxiliary structure 600 is the insulating layer 620 formed on the substrate 100, it does not need to be formed at the same time that the first conductive terminal 400 and the second conductive terminal 500 are formed by patterned etching the wiring layer 200 on the substrate 100. The insulating layer 620 can be formed after forming the first conductive terminal 400 and the second conductive terminal 500. Moreover, in some embodiments, the blocking member 800 can be made by an insulating material. Therefore, the blocking member 800 does not need to be formed at the same time that the first conductive terminal 400 and the second conductive terminal 500 are formed by patterned etching the wiring layer 200 on the substrate 100, and can be formed after forming the first conductive terminal 400 and the second conductive terminal 500 by coating the insulating material on the substrate 100.

In the embodiments mentioned above, an LED light source module is provided, including an auxiliary structure disposed between the first conductive terminal and the second conductive terminal. The top surface of the auxiliary structure is aligned with the top surface of the protective layer. Therefore, the light-emitting member can be horizontally disposed relative to the light guiding member. The utilization efficiency of light can be enhanced.

The Second Cluster of Embodiments

FIGS. 8-11E are schematic diagrams of an LED light source modules according to the second cluster of embodiments of the present invention. There is a difference between the first cluster of embodiments and the second cluster of embodiments, the auxiliary structure only contacts the rear part of the bottom of the light-emitting member in FIGS. 1 to 6, on the other hand, the auxiliary structure is formed to extend at least from the back surface of the light-emitting member to its light-emitting surface in FIGS. 8 to 11E. To simplify the description, in the subsequent embodiments, similar components (except for the auxiliary structures) will be represented by the same numberings.

Figure 7:
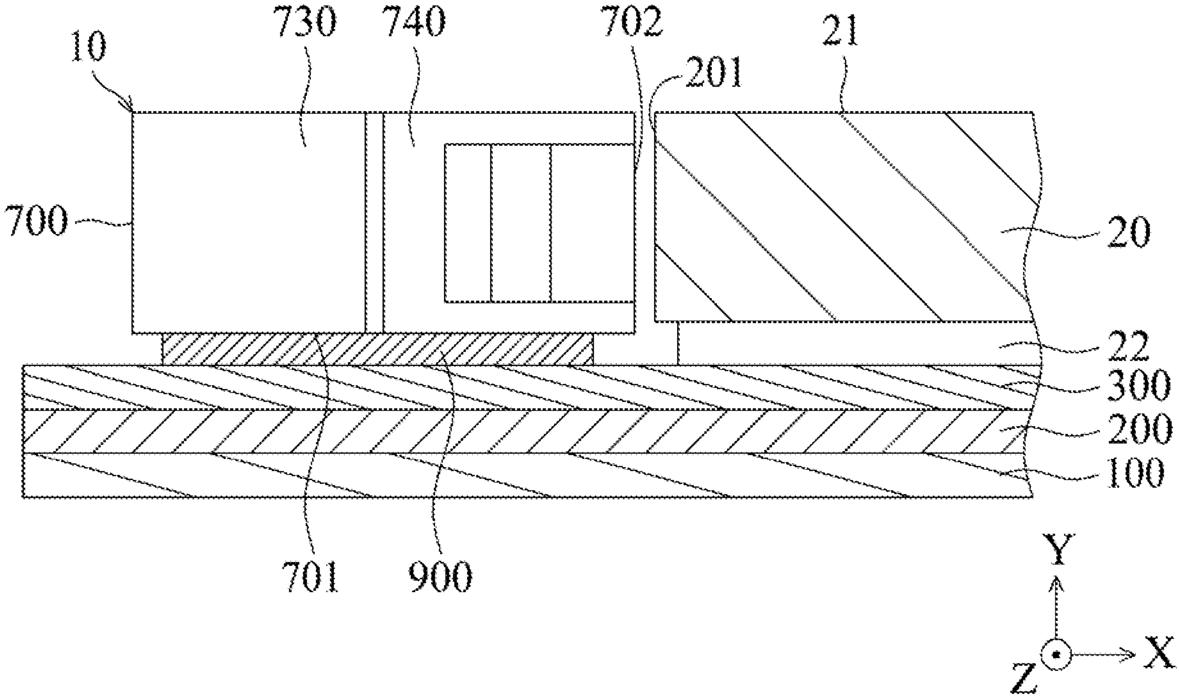
FIG. 7 is a section view of an LED light source module according to a second embodiment of this invention.
Figure 8:
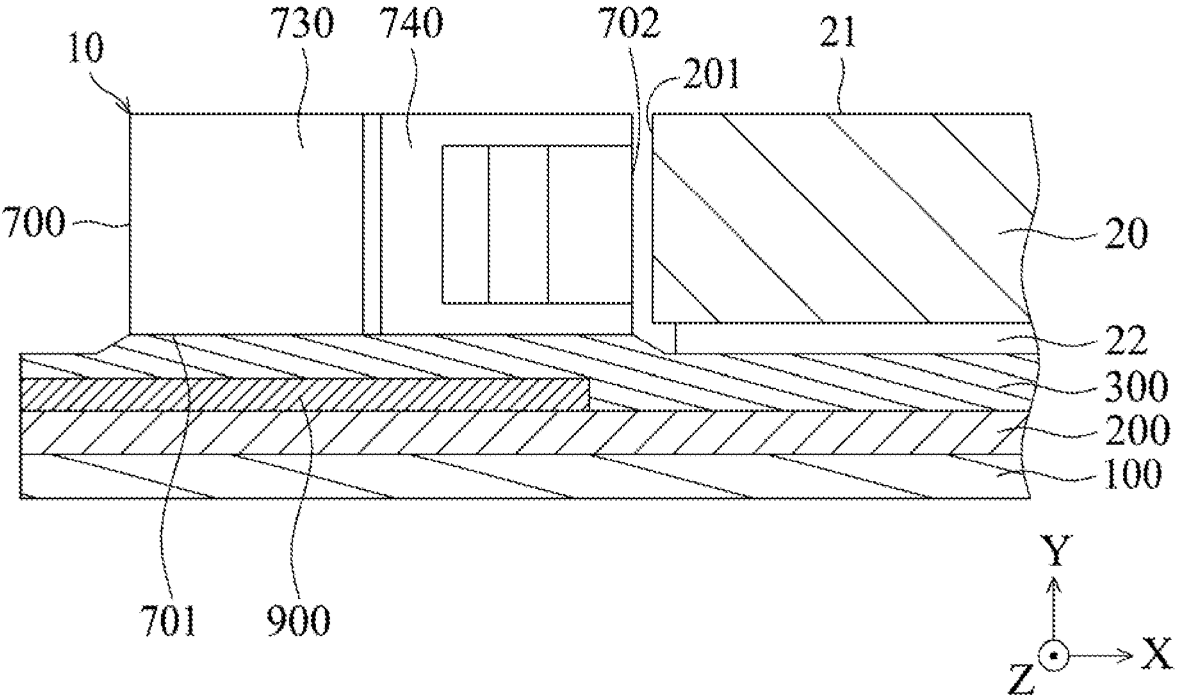
FIG. 8 is a section view of another type of an LED light source module according to the second embodiment of this invention.
Figure 9:
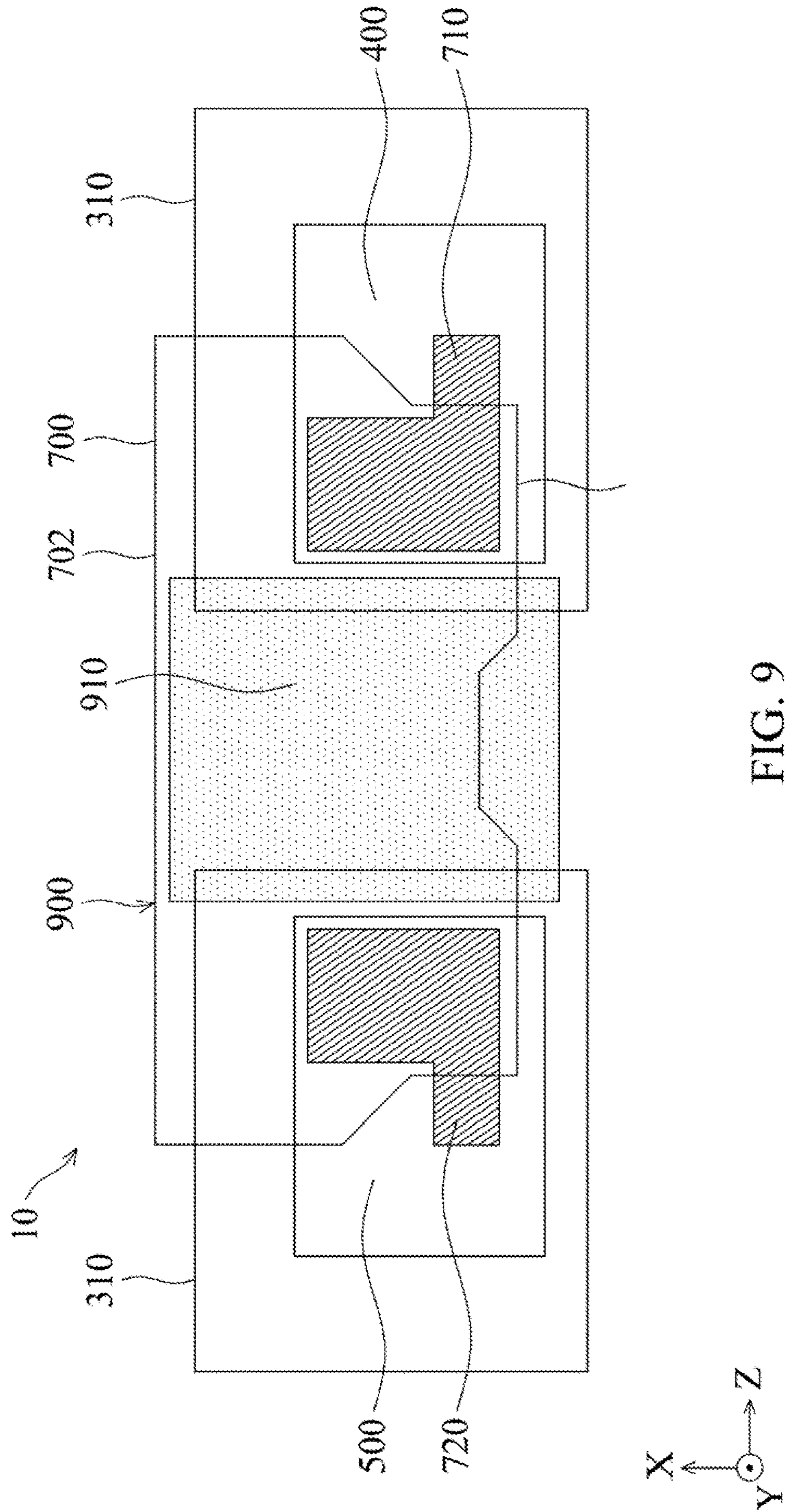
FIG. 9 is a partial top view of another type of an LED light source module according to the second embodiment of this invention.

Referring to FIGS. 7, 8, and 9, a second embodiment of the invention, an LED light source module 10 can be optically coupled to a light guiding member 20 (such as a light guiding plate). The LED light source module 10 provides light to a light-entering surface 201 of the light guiding member 20. After entering the light guiding member 20, the light can be guided thereby and form a surface light on a light-emitting surface 21. The LED light source module 10 primarily comprises a substrate 100, a wiring layer 200, a protective layer 300, a light-emitting member 700, and an auxiliary structure 900. Wherein, the auxiliary structure 900 is disposed between the substrate 100 and the light-emitting member 700, and the auxiliary structure 900 is disposed on the substrate 100 to support the bottom surface of the light-emitting member 700. In the second embodiment of the present invention, the wiring layer 200 and the protective layer 300 of the LED light source module 10 are disposed on the substrate 100, and the wiring layer 200 is located between the substrate 100 and the protective layer 300. Referring to FIG. 7, the auxiliary structure 900 is disposed on the protective layer 300; and in FIG. 8, the auxiliary structure 900 is disposed under the protective layer 300. In other words, it is not limited that the auxiliary structure 900 is disposed above or below the protective layer 300, as long as it can ensure that the auxiliary structure 900 support the light-emitting member 700 to achieve the purpose of aligning the light-entering surface 201 of the light guiding member 20.

In the embodiment of the LED light source module 10 shown in FIG. 9, the bottom surface of the light-emitting member 700 is provided with a first electrode 710 and a second electrode 720, and the protective layer 300 has at least one opening 310 and a plurality of conductive terminals which are exposed from the opening 310. The plurality of conductive terminals include first conductive terminals 400, and second conductive terminals 500. The conductive terminals are the pattern of the wiring layer 200 exposed in the opening 310, and the light-emitting member 700 and the wiring layer 200 are electrically connected by soldering materials. In this embodiment, the soldering materials may be a metal material, such as solder paste. In this embodiment, the soldering materials include a first soldering material and a second soldering material, and they are respectively provided in the range of the first conductive terminals 400 or the second conductive terminals 500. Although the soldering material is also provided between the light-emitting member 700 and the wiring layer 200, but for the purpose of supporting the light-emitting member 700, the supporting force of the auxiliary structure 900 is greater than the supporting force of the soldering materials. In other words, the auxiliary structure 900 has better support for the light-emitting member 700. It is understandable that the soldering material is not used for supporting purposes. Therefore, the first electrode 710 and the second electrode 720 can also be formed on the lateral surface of the light-emitting member 700 and electrically connected to the wiring layer 200 through the soldering materials.

In the embodiment of the LED light source module 10 shown in FIG. 9, the auxiliary structure 900 has a main support portion 910, which is provided on the substrate 100 to support the bottom surface of the light-emitting member 700, and the main support portion 910 at least extends from the back surface 703 of the light-emitting member 700 to the light-emitting surface 702 and does not contact the first electrode 710 and the second electrode 720. In this way, the bottom surface of the light-emitting member 700 is stably supported by the main support portion 910 and aligned with the light-entering surface 201 of the light guide member 20 to achieve a better light coupling effect and light using efficiency. It should be noted that, generally speaking, the first electrode 710 and the second electrode 720 of the light-emitting member 700 are usually located on opposite sides, and the first electrode 710 and the second electrode 720 are respectively electrically connected to the wiring layer 200 through the first soldering material and the second soldering material. There is a blank area between the first electrode 710 and the second electrode 720, and the main support portion 910 is provided on the blank area and between the first soldering material and second soldering material. Thus, the auxiliary structure 900 is substantially set on the same plane as the first soldering material and the second soldering material and supports the bottom of the light-emitting member 700.

Figure 10A:
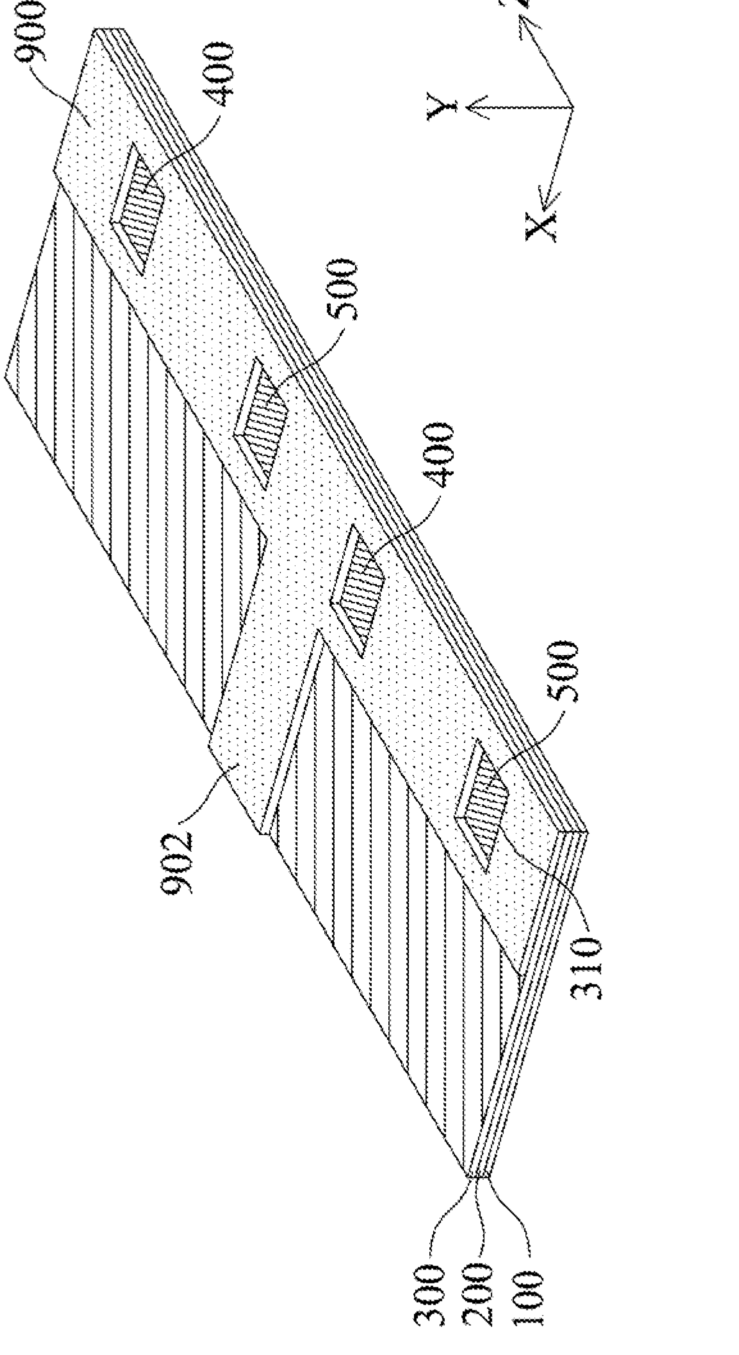
FIG. 10A is a schematic diagram showing an LED light source module without light-emitting member according to the second embodiment of this invention.
Figure 10B:
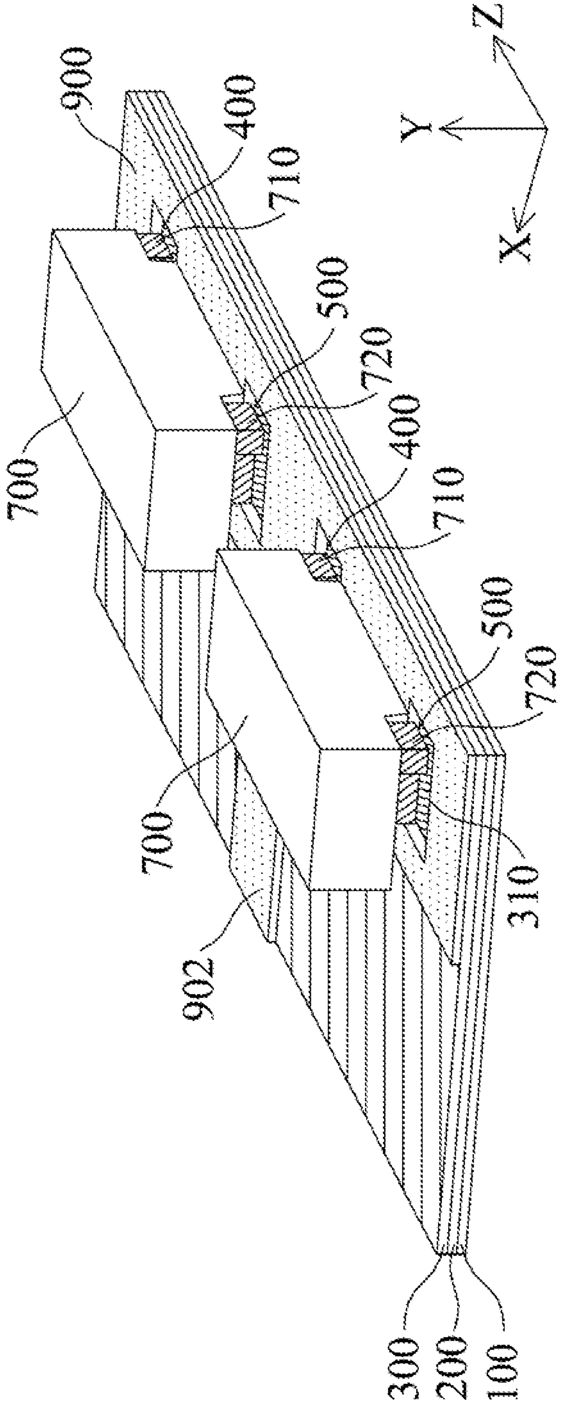
FIG. 10B is a schematic diagram showing an LED light source module according to the second embodiment of this invention.

Although the openings 310 in FIGS. 10A and 10B are formed in a one-to-one manner with the first conductive terminal 400 and the second conductive terminal 500, however, in other embodiments of the present invention, according to different electrode types of light-emitting member or process requirements, multiple conductive terminals may be exposed in the same opening 310 as shown in FIGS. 2A and 2B.

In some embodiments, as shown in FIGS. 10A and 10B, the auxiliary structures 900 between two adjacent light-emitting members 700 can be connected with each other. In addition, the auxiliary structures 900 connected each other between two adjacent light-emitting members 700 can further form an extension portion 902, which extends toward the light-emitting direction (+X axis direction) of the light-emitting member 700. In the LED light source module 10, the auxiliary structure 900 has a first reflectivity, and the protective layer 300 has a second reflectivity, the first reflectivity is greater than or equal to the second reflectivity. The generation of bright and dark bands can be reduced via the reflectivity of the auxiliary structure 900 is close to the reflectivity of the reflective sheet. In addition, in FIG. 10A, a reflective sheet and a light guide element can be provided on the area of the protective layer 300 without the auxiliary structure 900 and the extension portion 902; or the aforementioned reflective sheet and light guide element can also be stacked on the extension portion 902.

FIG. 10B is a schematic diagram of the light-emitting member 700 disposed in the LED light source module 10. As shown in the figure, there are a plurality of electrodes (such as the first electrode 710 and the second electrode 720) under the light-emitting member 700, which are electrically connected to the first conductive terminal 400 and the second conductive terminal 500 by soldering materials (not shown in the figure). When the light-emitting member 700 is arranged on the auxiliary structure 900 and the SMT(Surface Mount Technology) process is performed, the heated solder material (such as molten tin) tends to accumulate in the exposed area due to the characteristics of its surface tension, so it can be filled between the first electrode 710 and the first conductive terminal 400 and between the second electrode 720 and the second conductive terminal 500. Therefore the first electrode 710 and the second electrode 720 can be respectively electrically connected to the first conductive terminal 400 and the second conductive terminal 500 to provide the power required by the light-emitting member 700. In other embodiments, the plurality of aforementioned electrodes may also be formed on the lateral surface of the light-emitting member 700.

In some embodiments as shown in FIG. 10B, the auxiliary structure 900 can be formed directly below the light-emitting member 700 and other than the directly below region of the light-emitting member 700 at the same time. In other embodiments, the auxiliary structure 900 can be formed only directly below the light-emitting member 700. In addition, although the auxiliary structure 900 is formed to align the opening 310 in FIGS. 10A and 10B, in other embodiments of the present invention (for example, FIG. 9 and FIGS. 11A to 11E described hereafter), a part of the auxiliary structure 900 may extends into the opening 310 and forms a partial overlap with the opening 310.

In this embodiment, as in the first embodiment (refer to FIGS. 2A and 2B), a blocking member may be provided on the substrate 100 and accommodated in the opening 310 of the protective layer 300. When the light-emitting member 700 is disposed on the auxiliary structure 900, the blocking member will contact the lateral surface opposite to the light-emitting surface 702 of the light-emitting member 700 (i.e. the back surface 703). Therefore, if the user accidentally pushes the light-emitting member 700 toward the –X axis when installing the light guide member 20, the blocking member can provide sufficient support to prevent the light-emitting member 700 from being moved or tilted.

Figure 11A:
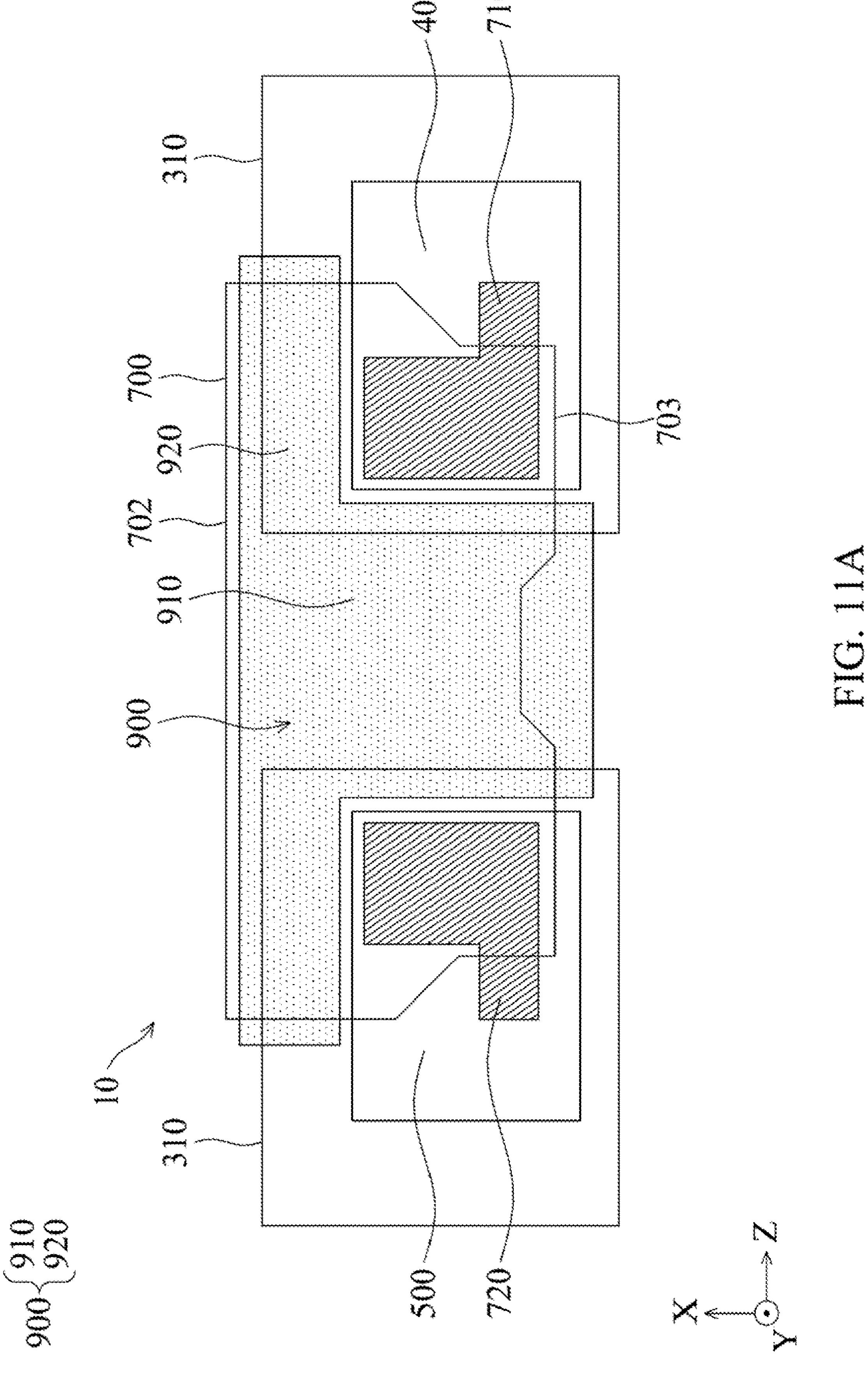
FIG. 11A is a partial top view of another type of an LED light source module according to the second embodiment of this invention.
Figure 11B:
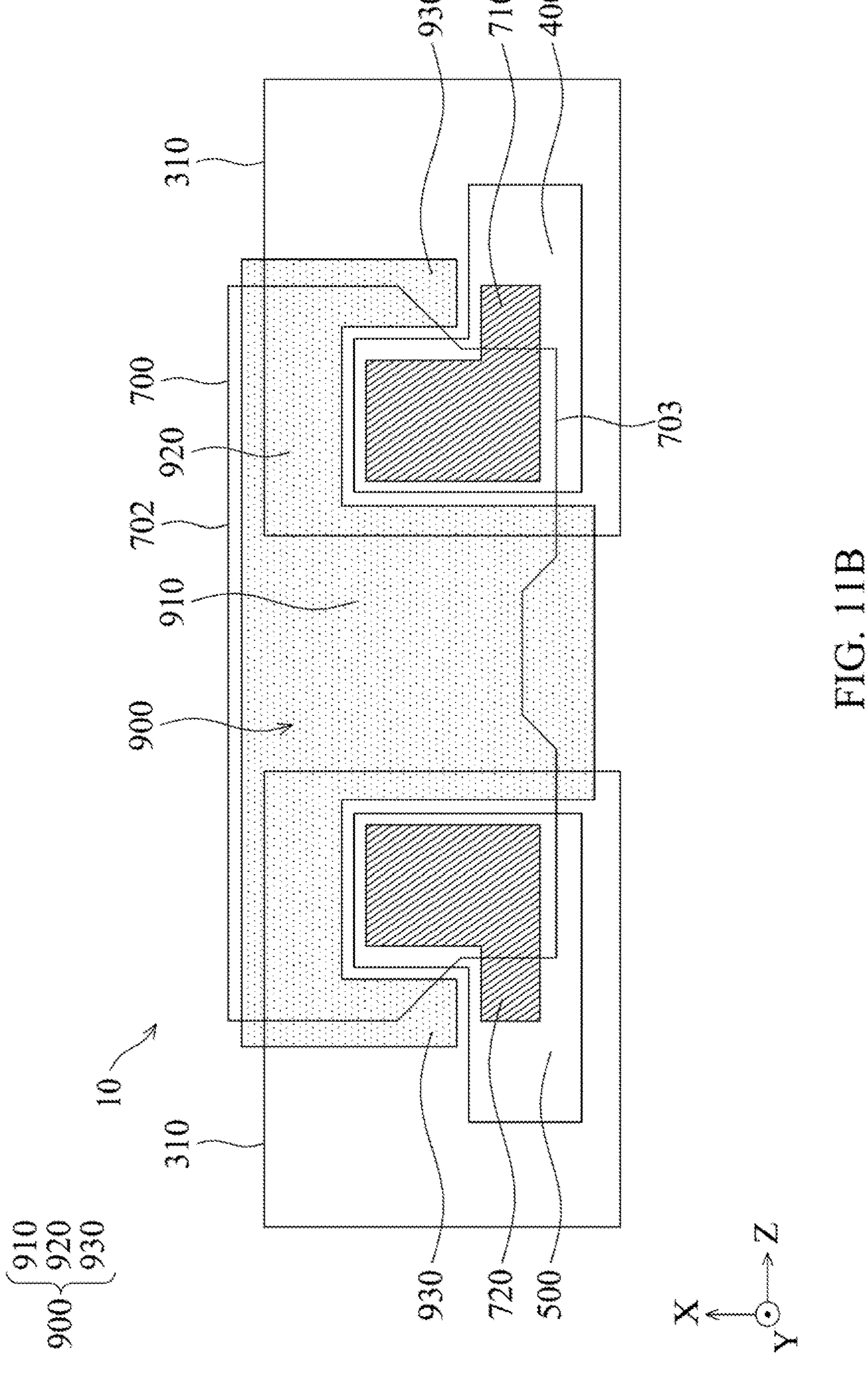
FIG. 11B is a partial top view of another type of an LED light source module according to the second embodiment of this invention.
Figure 11C:
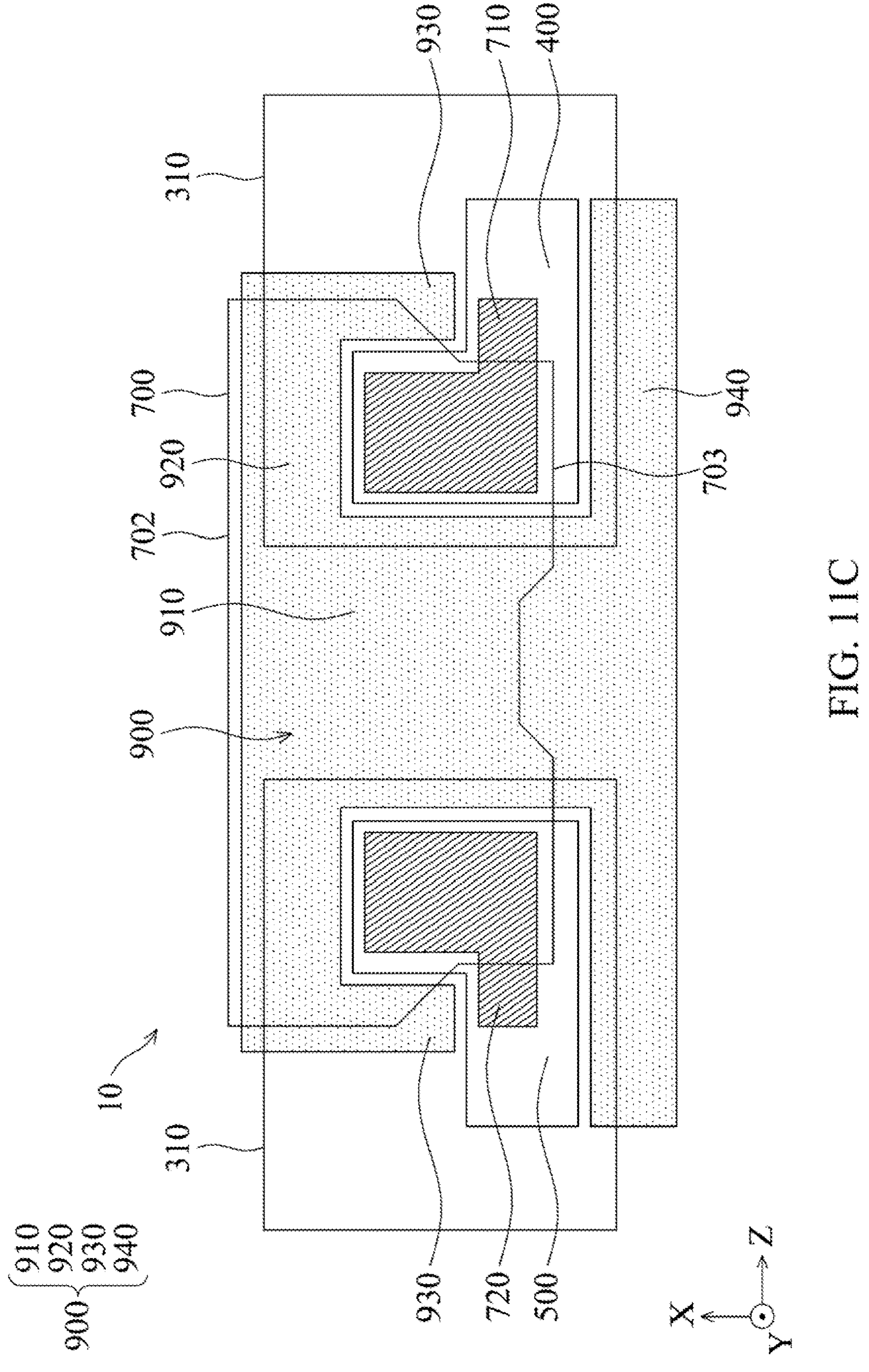
FIG. 11C is a partial top view of another type of an LED light source module according to the second embodiment of this invention.

FIGS. 11A-11G are partial top views of the LED light source module 10 according to another embodiment. As shown in FIGS. 11A-11C, a first electrode 710 and a second electrode 720 are provided on the bottom surface of the light-emitting member 700, and electrically connected to the first conductive terminal 400 and the second conductive terminal 500 by soldering material. It is understandable that the first electrode 710 and the second electrode 720 can be formed on the lateral surface of the light-emitting member 700. For example, in some embodiments, the first electrode 710 and the second electrode 720 can be provided on the same lateral surface. In other embodiments, the first electrode 710 and the second electrode 720 can be disposed on different lateral surfaces. In addition, an auxiliary structure 900 is also provided under the light-emitting member 700, and the auxiliary structure 900 does not contact the first electrode 710, the second electrode 720, and nor the soldering material.

Referring to the LED light source module 10 shown in FIG. 11A, in some embodiments, the auxiliary structure 900 further includes at least one front support portion 920. The front support portion 920 is disposed on the substrate 100 and is at least located between the first electrode 710 and the light-emitting surface 702 of the light-emitting member 700, or between the second electrode 720 and the light-emitting surface 702 of the light-emitting member 700. In some embodiments, the front support portion 920 extends from the main support portion 910 to the lateral surface of the light-emitting member 700. In some other embodiments, the front support portion 920 extends from the main support portion 910 toward the lateral surface of the light-emitting member 700 and beyond the aforementioned lateral surface. In this way, it can be ensured that the front part of the bottom of the light-emitting member 700 is supported by the front support portion 920, the light-emitting member 700 will not tilt forward and achieves the effect of horizontal support.

Referring to the LED light source module 10 shown in FIG. 11B, in some embodiments, the auxiliary structure 900 further includes at least one side support portion 930. The side support portion 930 is located outside of the first electrode 710 or the second electrode 720, and at least a part of the side support portion 930 is located between the first electrode 710 and the lateral surface of the light-emitting member 700 or between the second electrode 720 and the lateral surface of the light-emitting member 700 in the Z direction. In other embodiments, at least one side support portion 930 extends from the front support portion 920 toward the back surface 703 of the light-emitting member 700. In this way, it can be ensured that the front part of the bottom of the light-emitting member 700 is supported by the side support portion 930, and the light-emitting member 700 dose not incline to the left or right and achieves the effect of horizontal support.

Referring to the LED light source module 10 shown in FIG. 11C, the auxiliary structure 900 further includes at least one rear support portion 940. In some embodiments, the at least one rear support portion 940 extends from the main support portion 910 toward a direction away from the light-emitting surface 702 of the light-emitting member 700. In other embodiments, the at least one rear support portion 940 is located behind the plurality of electrodes (for example, the first electrode 710 and the second electrode 720) and extends in a direction away from the light-emitting surface 702 of the light-emitting member 700. As shown in FIG. 11C, the rear support portion 940 may also have a portion extending from the main support portion 910 toward a direction away from the light-emitting surface 702 of the light-emitting member 700, and a portion located behind the first electrode 710 and the second electrode 720 and extending in a direction away from the light-emitting surface 702 of the light-emitting member 700. In this way, it can be ensured that the rear part of the bottom of the light-emitting member 700 is supported by the rear support portion 940, and the light-emitting member 700 will not tilt backward and achieves the effect of horizontal support.

Figure 11D:
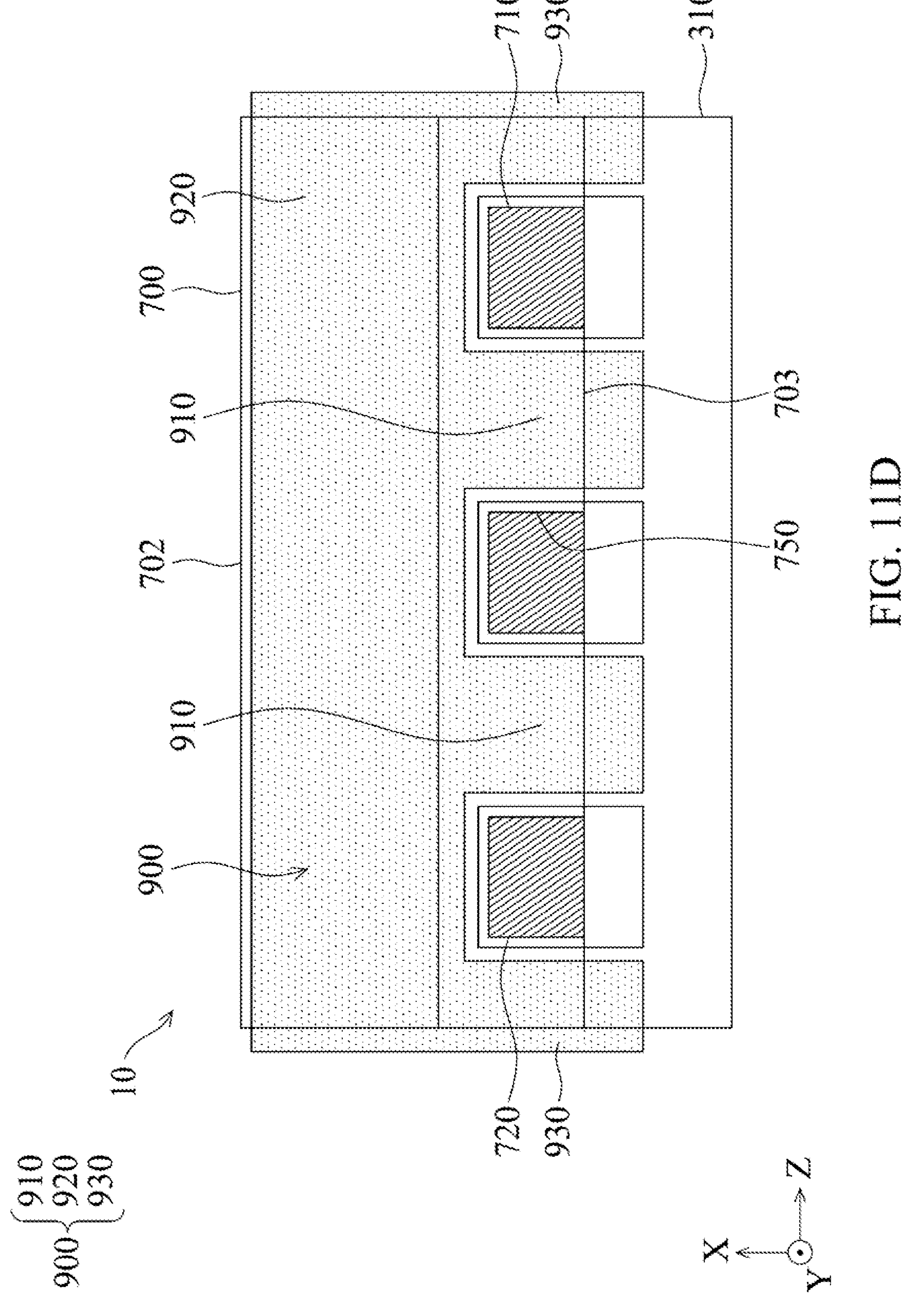
FIG. 11D is a partial top view of another type of an LED light source module according to the second embodiment of this invention.

FIG. 11D is a partial top view of the LED light source module 10 according to another embodiment. As shown in FIG. 11D, the light-emitting member 700 has a first electrode 710, a second electrode 720, and a third electrode 750, wherein the third electrode 750 is disposed between the first electrode 710 and the second electrode 720. In addition to the first conductive terminal and the second conductive terminal provided in the opening 310 of the protective layer 300, a third conductive terminal may be further disposed between the first conductive terminal and the second conductive terminal. The first electrode 710, the second electrode 720, and the third electrode 750 are respectively electrically connected to the first conductive terminal, the second conductive terminal, and the third conductive terminal through a soldering material. In some embodiments, an auxiliary structure 900 is provided between the first electrode 710, the second electrode 720, and the third electrode 750, including a main support portion 910 and a front support portion 920. In other embodiments, an auxiliary structure 900 is provided between at least one of the electrodes and the light-emitting surface. The auxiliary structure 900 may provide only the main support portion 910 or any combination of other support portions.

In this embodiment, the first electrode 710, the second electrode 720, and the third electrode 750 in the LED light source module 10 of FIG. 11D may also be formed on the lateral surface of the light-emitting member 700. For example, in some embodiments, the first electrode 710, the second electrode 720, and the third electrode 750 may be arranged on the same lateral surface. In some other embodiments, the first electrode 710, the second electrode 720, and the third electrode 750 may also be arranged on the different lateral surfaces.

Referring to FIG. 11D, an auxiliary structure 900 is also provided under the light-emitting member 700. The auxiliary structure 900 does not contact the first electrode 710, the second electrode 720, the third electrode 750, and nor the soldering material. The auxiliary structure 900 also has a main support portion 910 located between the plurality of electrodes (the first electrode 710, the second electrode 720, and the third electrode 750), and a front support portion 920 between the plurality of electrodes and the light-emitting surface 702 of the light-emitting member 700, and the side support portions 930 located outside of the plurality of electrodes in the Z direction. In addition, the number of electrodes of the light-emitting member 700 is not limited in this embodiment. In other embodiments, the number of electrodes of the light-emitting member 700 may be three or more.

Figure 11E:
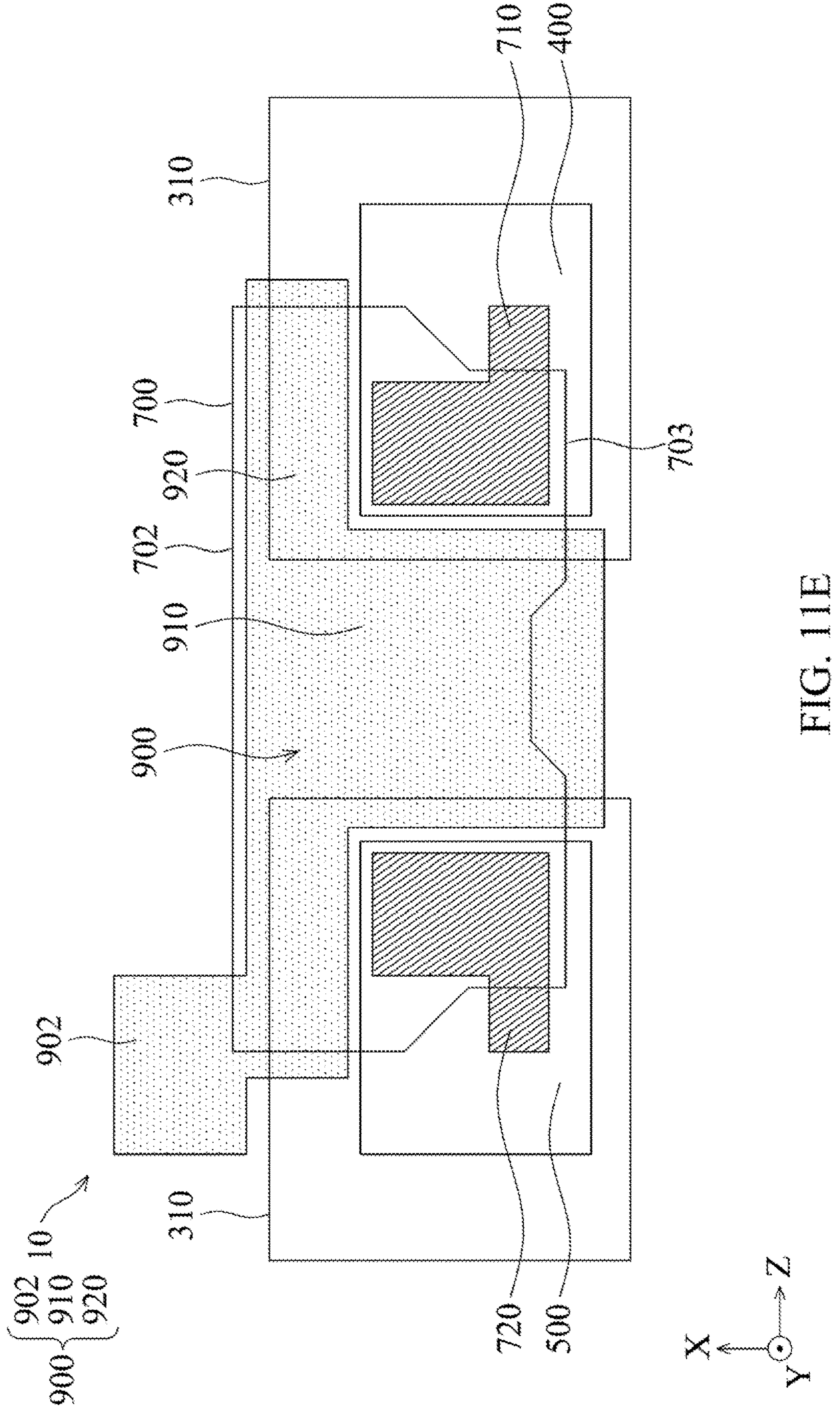
FIG. 11E is a partial top view of another type of an LED light source module according to the second embodiment of this invention.
Figure 11F:
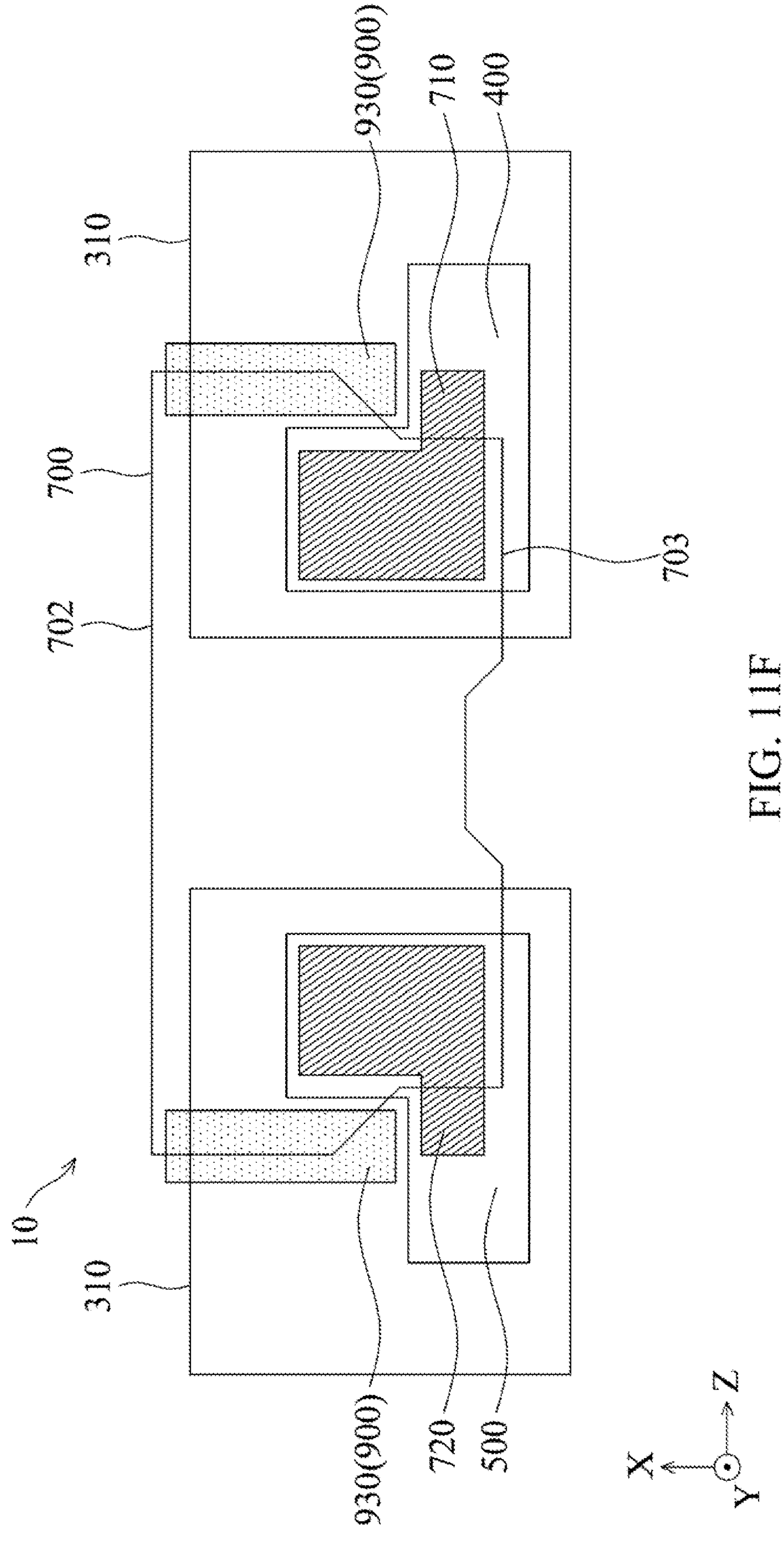
FIG. 11F is a partial top view of another type of an LED light source module according to the second embodiment of this invention.
Figure 11G:
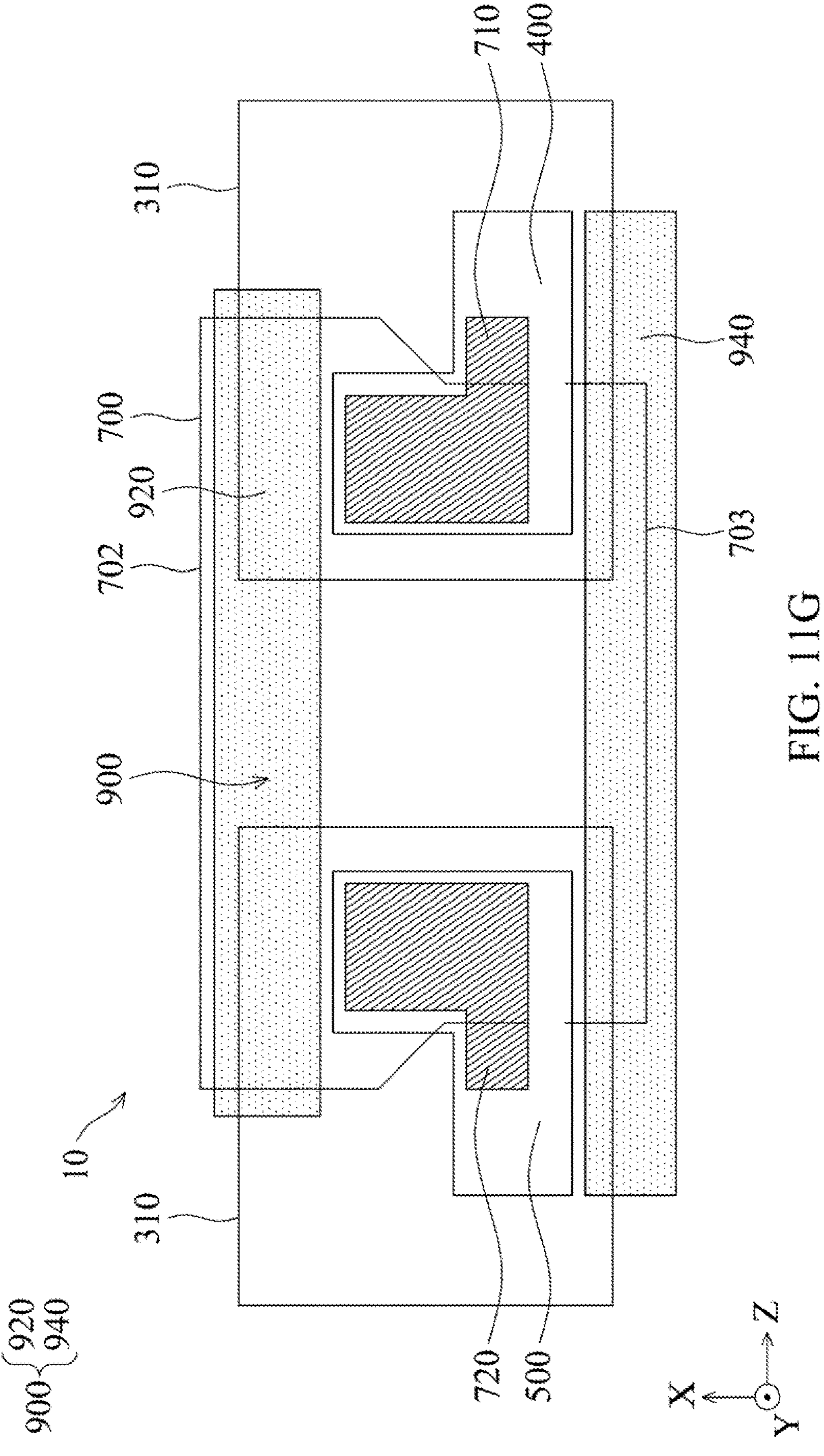
FIG. 11G is a partial top view of another type of an LED light source module according to the second embodiment of this invention.

Referring to FIG. 11E, in some embodiments, the extension portion 902 may extend from the front support portion 920 of the auxiliary structure 900 toward a direction away from the back surface 703 of the light-emitting member 700 and exceeds the light-emitting surface 702. In some other embodiments, the extension portion 902 may also extend from the main support portion 910 toward a direction away from the back surface 703 of the light-emitting member 700 and exceeds the light-emitting surface 702.

It should be particularly noted that, the combination of the main support portion 910, the front support portion 920, the side support portion 930, and the rear support portion 940 described separately in this embodiment can be selected as requirement to support the bottom surface of the light-emitting member 700. For example, in one embodiment, referring to FIG. 11F, at least two side interposed portions 930 may be provided between the plurality of electrodes and the lateral surface of the light-emitting member to support the bottom surface of the light-emitting member 700. In another embodiment, referring to FIG. 11G, at least a front interposed portion 920 and a rear interposed portion 940 may be provided to support the bottom surface of the light-emitting member 700 from behind the plurality of electrodes, which can also support the light-emitting member 700 to achieve the purpose of the light-emitting surface 702 of the light-emitting member 700 aligning with the receiving surface of the light guiding member 20. In addition to the aforementioned embodiment of providing two side interposed portions 930 or providing a front interposed portion 920 and a rear interposed portion 940, the aforementioned main support portion 910 can also be supplemented to support the light-emitting member 700, therefore, the area supported by the auxiliary structure 900 of the light-emitting member 700 will be increased to achieve a better support effect. The combination of the support portions is not limited to which aforementioned.

As described above, according to the second embodiment of this invention, there is an auxiliary structure 900 at the bottom of the light-emitting member 700, wherein the main support portion 910 of the auxiliary structure 900 is provided on the substrate 100 and extends from the back surface 703 to the light-emitting surface 702 of the light-emitting member 700 to support the bottom of the light-emitting member 700. In this way, the light from the light-emitting member 700 can be aligned with the receiving surface of the light guiding member 20, and the light use efficiency is improved.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, compositions of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. Moreover, the scope of the appended claims should be accorded the broadest interpretation so as to encompass all such modifications and similar arrangements.

Although the present invention is disclosed in the foregoing several preferred embodiments, they are not intended to limit the present invention. Those with ordinary skill in the art of the present invention can make some changes and modifications without departing from the spirit and scope of the present invention. Therefore, the protection scope of the present invention shall be subject to those defined by the attached claims. In addition, the scope of each claim constitutes an independent embodiment, and various combinations of claims and embodiments are within the scope of the present invention.

What is claimed is:

1. An LED light source module, comprising:
- a substrate;
- a protective layer, disposed on the substrate and having at least one opening;
- a plurality of conductive terminals, arranged in the at least one opening;
- a light-emitting member, including a bottom surface, a first lateral surface connected to the bottom surface, a second lateral surface connected to the bottom surface and opposite to the first lateral surface, a light-emitting surface connected to the bottom surface, a back surface connected to the bottom surface and opposite to the light-emitting surface, and a plurality of electrodes, wherein the light-emitting surface and the back surface are located between the first lateral surface and the second lateral surface, and the electrodes are electrically connected to the conductive terminals respectively; and
- an auxiliary structure, including at least two interposed portions arranged between the substrate and the light-emitting member, wherein the back surface is opposite to the light-emitting surface in a first direction, and the interposed portions are arranged at an interval in the first direction.

2. The LED light source module as claimed in claim 1, wherein the electrodes are located on the bottom surface of the light-emitting member, the interposed portions are located outside of the electrodes, at least a part of one of the interposed portions is located between the electrodes and the first lateral surface of the light-emitting member, and at least a part of the other one of the interposed portions is located between the electrodes and the second lateral surface of the light-emitting member.

3. The LED light source module as claimed in claim 1, wherein one of the interposed portions is provided on the substrate and located between the electrodes and the light-emitting surface of the light-emitting member.

4. The LED light source module as claimed in claim 1, wherein one of the interposed portions is provided behind the electrodes and extends in a direction away from the light-emitting surface of the light-emitting member.

5. The LED light source module as claimed in claim 1, wherein the interposed portions are provided on the substrate.

6. The LED light source module as claimed in claim 1, wherein the interposed portions are located between the electrodes and an outer periphery of the light-emitting member.

7. The LED light source module as claimed in claim 1, wherein the interposed portions are arranged symmetrically or parallelly.

8. The LED light source module as claimed in claim 1, wherein the interposed portions surround the conductive terminals with a non-enclosed shape to define a passway.

* * * * *